United States Patent [19]
Metzka

[11] Patent Number: 5,456,814
[45] Date of Patent: Oct. 10, 1995

[54] CONTACTING ARRANGEMENT FOR A CIRCUIT BOARD SUPPORT ASSEMBLY

[75] Inventor: Hans J. Metzka, Nürnberg, Germany

[73] Assignee: Metzka GmbH, Germany

[21] Appl. No.: 255,373

[22] Filed: Jun. 8, 1994

[30] Foreign Application Priority Data

Jul. 1, 1993 [DE] Germany ............... 93 09 768.9

[51] Int. Cl.[6] ................ C25D 17/06; C25D 17/08
[52] U.S. Cl. ................ 204/297 R; 204/297 W
[58] Field of Search .................. 204/286, 279, 204/297 W, 297 R; 205/125, 128; 118/620; C25D 17/06

[56] References Cited

U.S. PATENT DOCUMENTS 4,606,891  8/1986  Murphy, Jr. et al. ............ 204/297 W
4,647,358  3/1987  Bartsch et al. ............... 204/286
4,988,426  1/1991  Metzka ..................... 204/297 R

FOREIGN PATENT DOCUMENTS 3027751  2/1982  Germany.
4005209  8/1991  Germany.

Primary Examiner—Kathryn Gorgos

[57] ABSTRACT

A contacting arrangement for a circuit board support assembly of an electroplate installation has first and second spaced-apart bar members connected together by spacers. The first bar member carries contact clamps from which first contact members project. Spring members project from the second bar member towards the first bar member, each of the spring members being provided with at least one second contact member. The first and second contact members co-operate to hold a board therebetween, associated pairs of contact members being urged towards each other at contact surfaces thereof by way of the associated spring member.

13 Claims, 2 Drawing Sheets

CONTACTING ARRANGEMENT FOR A CIRCUIT BOARD SUPPORT ASSEMBLY

BACKGROUND OF THE INVENTION

The manufacture of printed circuit boards typically involves the use of a printed circuit board support assembly for example for supporting a printed circuit board in a galvanic or electroplate installation. Such an assembly may include a contacting arrangement for use in the printed circuit board support assembly of such an installation; the contacting arrangement having contact members for contacting a respective printed circuit board. In this respect, attention may be directed to U.S. Pat. No 4 988 426 which discloses such a holding or contacting arrangement, which can also be referred to as a torsion bar-type support assembly. Such assemblies are also described in the prospectus issued by the present applicants and entitled '. . . modernste Leiterplatten-Produktion mit Roboter-Konzept' to which reference may therefor be made. However, such assemblies often leave something to be desired, in particular in regard to their repair-friendliness.

DE 30 27 751 C2 discloses an apparatus for the galvanic metallization of substrates having a non-conductive, durable and more especially U-shaped holding frame which is adapted to stably hold the substrates in the electrolyte and to provide contact with a contact bar which is connected as a cathode. That system has a shaped frame structure for carrying one or more substrates, and the frame structure is bridged at the top by the conductive contact bar and, in parallel relationship therewith, a non-conductive substrate abutment. Claw members for contacting the substrates are also fixed between the contact bar and the substrate abutment. Adjustable holders are also disposed at the top on the contact bar for conductively fixing the frame structure and the inside of the frame structure, which serves to accommodate the substrates, is at least partially covered by shielding means at the front and rear sides. That system, therefore, has a large number of individual components, and trot in turn has an effect on manipulation and operation of that system.

An apparatus for restricting down field lines in an electroplate or galvanic installation for the treatment of substantially plate-like workpieces such as printed circuit boards which are introduced into a suitable treatment bath in a condition of being suspended on an article carrier; the apparatus having a shield member which is guided on the bath container displaceably in a vertical direction, is to be found in DE 40 05 209 C2. The article carrier of that apparatus carries a holddown member which is displaceable in respect of height and which is mounted in such a way that it can be fixed in a respective set position and which moves the shield members that are arranged laterally of the workpieces to be galvanized into a preselected position when the article carrier is introduced into the treatment station.

SUMMARY OF THE INVENTION

An object of the present invention is to provide a contacting arrangement for a printed circuit board support assembly which is of a mechanically stable and robust configuration and which is easy to actuate.

Another object of the present invention is to provide a contacting arrangement for a printed circuit board support assembly which is particularly easy to repair.

Still another object of the present invention is to provide a contacting arrangement for holding a printed circuit board in a support assembly, which affords sound reliable contacting with a printed circuit board by means of a simple operating procedure.

In accordance with the principles of the present invention, the foregoing and other objects are achieved by a contacting arrangement for a printed circuit board support assembly or rack, having contact members for contacting such a board. The contacting arrangement comprises first and second spaced-apart bar members which are connected together at a spacing by suitable spacer members. One of the bar members is provided with contact clamps from which first contact members project. Projecting away from the second bar member towards the first bar member are spring members, each of which is provided with at least one second contact member. The first and second contact members are arranged in such a way that they are co-operable in respective pairs and are pressed with respective contact surfaces towards each other by means of the respectively associated spring member.

In accordance with a preferred feature of the invention, the first bar member comprises a core portion of a material which is a good conductor of electricity, and a casing of chemically resistant material which bears closely or snugly against the core portion. The core desirably comprises copper while the surrounding casing comprises V4A high-quality steel.

Preferably, the first bar member is of a round cross-section and each contact clamp is in the form of a sleeve which is electrically conductively fixed on the first bar member and from which the corresponding first contact member projects tangentially in the form of a bar portion provided with the associated contact surface. The contact clamp in the form of the sleeve is preferably welded fast to the first bar member. It is accordingly desirable for the contact clamp to be made from the same material as the casing of the first bar member, which surrounds the electrically conductive core portion. The contact clamp may, therefore, also comprise for example V4A high-quality steel.

Preferably, the or each bar portion constituting the respective first contact member is provided with a raised portion that affords the contact surface, on the side which is towards the corresponding spring member. The raised portion may be formed integrally on the corresponding bar portion, but it is also possible for the raised portion to be fixed to the bar portion, for example by welding. The bar portion with the raised portion thereof may also be of V4A high-quality steel.

Advantageously, the or each bar portion constituting the first contact member projects away from the first bar member, on the side which is remote from the second bar member. That arrangement can provide for a relatively long spring travel motion on the part of the corresponding spring member and consequently the contact members. That makes it possible to establish as desired the springing characteristics and, consequently, also the contact or pressure force exerted between the contact members of the corresponding pair thereof.

The contacting arrangement according to the invention is of a simple configuration if the or each spring member is in the form of a spring plate with at least one contact pin disposed thereon to form the corresponding second contact member. The end face of the at least one contact pin, which is remote from the spring plate, forms the corresponding contact surface. The spring plate comprises for example a commercially available spring steel to which the contact pin forming the corresponding second contact member is suitably fixed, for example by riveting or preferably welding.

A preferred feature of the invention provides that the or each spring plate is screwed fast to the second bar member in order to provide that the contacting arrangement according to the invention is particularly easy and convenient to repair.

In accordance with another feature of the invention, the above-mentioned optimum springing properties on the part of the contacting arrangement according to the invention can be still further improved by the or each said spring plate being screwed fast to a fixing portion of the second bar member, which fixing portion is remote from the first bar member. In that configuration, the free end portion of the or each spring plate, which is remote from said fixing portion and from which at least one said contact pin projects towards the associated contact member of the first bar member projects beyond the side of the first bar member, which is remote from the second bar member. That configuration affords a relatively long distance between the above-mentioned fixing portion and the free end portion of the spring member and consequently gives a relatively long spring travel motion for the at least one second contact member associated with the second bar member.

The or each spring plate can be easily fixed to the second bar member if the latter is of a solid quadrangular cross-section. That configuration also affords a high level of mechanical strength and stability in respect of shape for the arrangement according to the invention if, in accordance with a further preferred feature, the second bar member is so oriented that one of its two diagonals is directed towards the first bar member.

In another preferred feature of the invention, the spring member may carry an actuating member or portion for the purposes of moving the contact members of the corresponding pair thereof away from each other. The actuating member or portion may be a pin portion which is fixed to the spring plate between the first and second bar members and which projects beyond the two bar members, on the side remote from the spring plate. That provides that the actuating portion or member is readily accessible and can thus be easily actuated to spread the contact members of the respective pair apart.

The contacting apparatus according to the invention, with the exception of the contact surfaces of the contact members, is preferably covered with an electrically insulating coating. The coating is chemically resistant so that the arrangement can enjoy a long service life as a result. The coating can also at least minimize the entrainment of bath substance from one bath to another. In accordance with the invention, in a preferred feature the structure comprising the first and second bar members and the spacers which connect the first and second bar members at a spacing from each other as well as the contact clamps on the first bar member with the associated bar portions thereof are coated with a suitable material, with only the corresponding contact surfaces projecting bare from the coating. Likewise, each spring member with the at least one pin forming the corresponding second contact member is suitably coated, with the exception of the end face of the pin. The coating may be of any suitable nature such as an electrostatic coating, a turbulence or eddy coating or the like.

Further objects, features and advantages of the present invention will be apparent from the following description of a preferred embodiment.

DESCRIPTION OF THE PREFERRED EMBODIMENT

Figure 1:
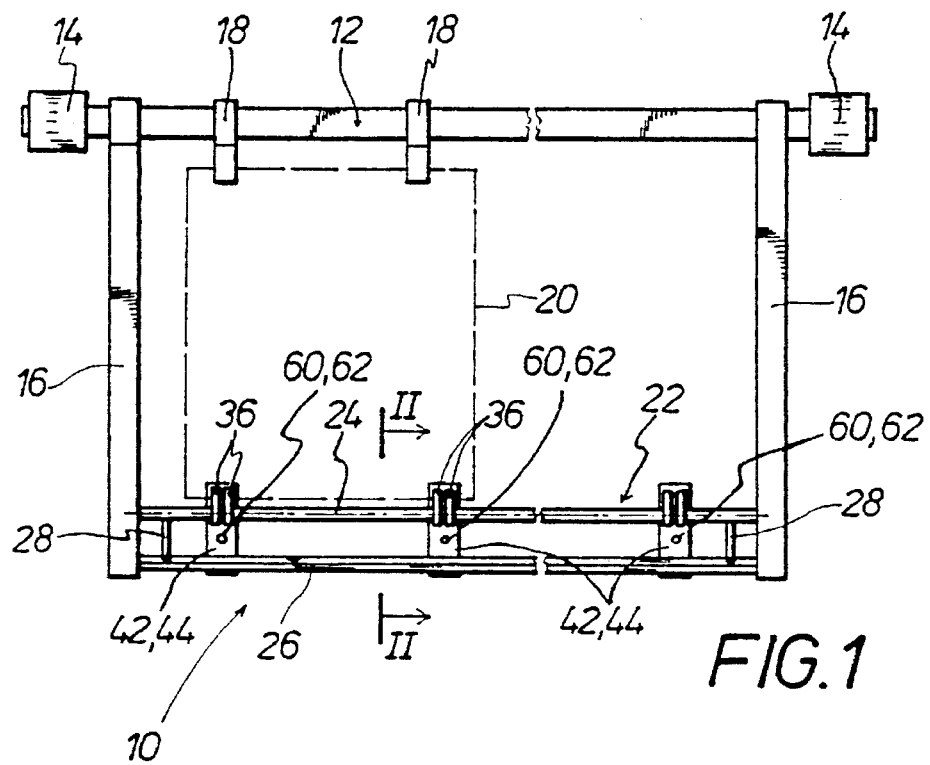
FIG. 1 is a side view of a contacting arrangement according to the invention in conjunction with parts of a galvanizing station of a galvanic electroplate installation.

Referring firstly to FIG. 1, reference numeral 10 therein generally denotes an apparatus forming part of a galvanizing station of a galvanic installation, with an article carrier 12 which is disposed on contact blocks 14. Connecting members 16 and holders 18 project downwardly from the article carrier 12. The holders 18 serve to locate printed circuit boards of which one is indicated by thin dotted lines in FIG. 1 and identified by reference numeral 20.

At their lower ends which are remote from the article carrier 12, the connecting members 16 are electrically conductively and mechanically firmly connected to each other by means of a contacting arrangement which is generally identified by reference numeral 22. The contacting arrangement or assembly 22 will be described in greater detail hereinafter with reference to FIG. 2. It may be noted at this point, however, that, as can be clearly seen from FIG. 1, it comprises a first bar member 24 and a second bar member 26 which are fixed at their ends to respective ones of the connecting members 16 and which are disposed at a spacing from each other in mutually parallel relationship, one above the other. The two bar members 24 and 26 are mechanically firmly connected together by spacer members as indicated at 28.

Figure 2:
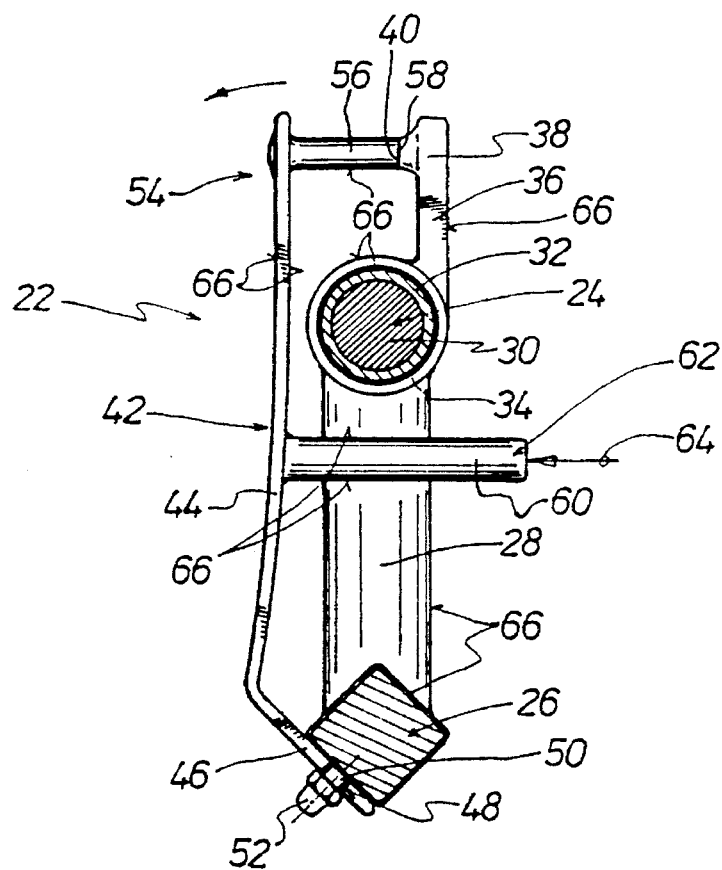
FIG. 2 is a view in section taken along line II—II in FIG. 1 through the arrangement according to the invention.
Figure 2A:
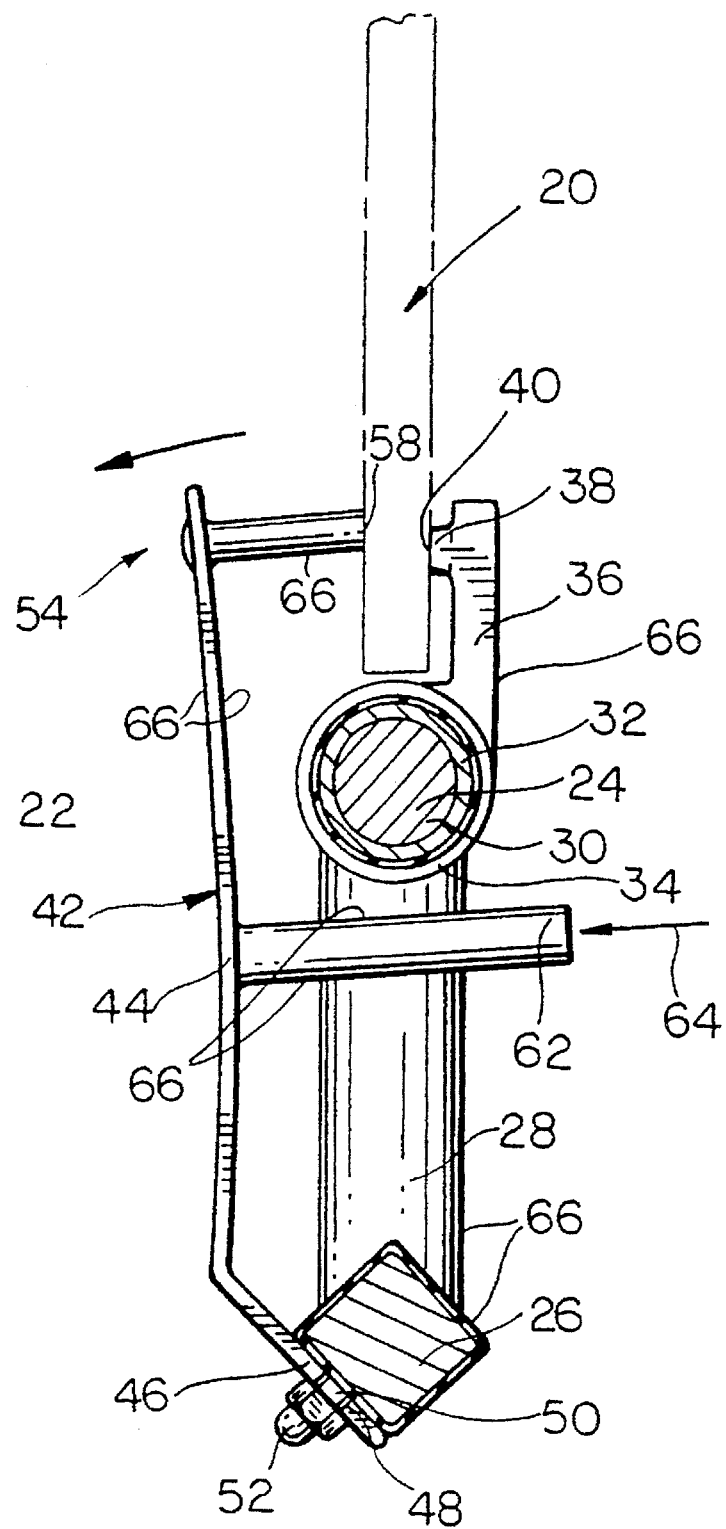
FIG. 2A corresponds to FIG. 2, showing the position of a circuit board between the contact members.

Looking now at FIG. 2, the first or upper bar member 24 comprises a core portion 30 of suitable electrically conductive material, preferably copper. The core portion 30 is enclosed by a casing 32 which bears snugly or closely against the core portion 30. The casing 32 comprises a suitable material, for example a chemically resistant material, such as V4A high-quality steel.

The first bar member 24 is provided with contact clamps 34 thereon, which are fixedly welded to the casing 32. The contact clamps 34 may also comprise any suitable material, for example above-mentioned V4A high-quality steel. Each contact clamp 34 has a strip or bar portion 36 which extends upwardly as shown in FIGS. 1 and 2 and which is formed integrally with the contact clamp 34 or which can be suitably secured thereto, for example by welding. The bar portion 36 may consequently also comprise for example V4A high-quality steel. The bar portion 36 which projects tangentially away from the first bar member 24 as can be clearly seen in FIG. 2 is provided adjacent its upward free end portion with a raised portion 38. The end face of the raised portion 38, which is remote from the strip portion 36, forms a contact surface 40 which serves for electrically conductively contacting a printed circuit board as indicated at 20 in FIG. 1.

So that the board 20 to be metallized can be reliably fixed in position at the contacting arrangement 22 and at the same time electrically conductively contacted, the contacting arrangement 22 has spring members 42 which are each formed by a spring plate 44 of suitable material such as spring steel. The corresponding spring plate 44 has a fixing edge portion 46 at the end thereof which is the lower end in FIG. 2, with at least one through hole 48. The respective spring member 42 is mechanically fixedly disposed on the second or lower bar member 26 by means of at least one screwthreaded pin 50 which projects from the second bar member 26 and which extends through the associated through hole 48 in the fixing edge portion 46 of the respective spring plate 44. It will be seen from FIG. 2 that the second bar member 26 is of a quadrangular such as a square solid cross-section. The spring plate 44 is then fixed to the second bar member 26 by means of a screw nut 52 which is screwed on to the corresponding screwthreaded pin 50 so that that arrangement is quick and easy to repair if necessary.

At the free end portion 54 of the spring plate 44, which is thus remote from the fixing edge portion 46 thereof, at least one pin 56 projects away from the spring plate 44 of the spring member 42, towards the raised portion 38 on the bar portion 36. The number of pins 56 corresponds to the number of closely juxtaposed contact clamps 34 with bar portions 36, to form corresponding pairs of contacts. For that purpose each contact pin 56 is provided at its free end with a contact surface 58 which can thus be operatively associated with the contact surface 40 on the respective raised portion 38 and which bears closely against the contact surface 40 in the inoperative position of the contacting arrangement 22, namely the condition in which no board 20 is gripped between the contact surfaces 40 and 58.

It will be seen that the contact surfaces 40 and 58 are pressed towards each other by means of the respective spring member 42. That pressing effect can be assisted by virtue of the fact that the spring plate 44 is curved or cambered towards the two bar members 24 and 26, between the free end portion 54 of the spring plate 44 and the fixing edge portion 46 thereof.

In a central portion between the two bar members 24 and 26, the spring plate 44 carries an actuating member 62 in the form of a pin portion which projects away from the spring plate 44 and thus extends towards the right in FIG. 2. If the actuating member 62 is actuated by being pushed towards the left in FIG. 2 in the direction indicated by the arrow 64, the contact surfaces 40 and 58 are spaced apart by virtue of the pin 56 at the free end portion 54 of the spring plate 44 moving away from the raised portion 38 of the corresponding bar portion 36, so that a board 20 to be metallized as shown in FIG. 1 can be inserted between the contact surfaces 40 and 58. When then the actuating member 62 is released by removal of the pushing force applied thereto towards the left in FIG. 2, the spring member 42 relaxes whereby the contact surface 58 moves towards the corresponding contact surface 40 and the appropriate locations of the board 20 to be metallized are electrically conductively contacted by the respective contact surfaces 40 and 58 and the board 20 is also held clamped fast therebetween.

With the exception of the above-mentioned contact surfaces 40 and 58 and the screwthreaded pins 50 and the internally screwthreaded portions of the screw nuts 52, the contacting arrangement 22 is covered all over with an electrically insulating coating as diagrammatically indicated at 66 in FIG. 2.

It will be seen from the foregoing that the contacting arrangement described is mechanically highly stable and robust, while the spring members provide for secure reliable contacting of a printed circuit board to be processed.

It will be appreciated that the above-described arrangement according to the present invention has been set forth solely by way of example and illustration of the principles of the invention and that various modifications and alterations may be made therein without thereby departing from the spirit and scope of the invention.

What is claimed is:

1. A contacting assembly for a printed circuit board support assembly of an electroplate installation having a carrier means for locating a first edge of a printed circuit board and connecting members connecting the carrier means in spaced apart relation to the contacting assembly, the contacting assembly comprising first and second spaced-apart bar members, spacer means connecting the bar members together at a spacing, contact clamp means on the first bar member, at least one pair of associated, opposing first and second contact members, the first contact member projecting from the clamp means for contacting a first face of a printed circuit board at an area adjacent a second edge of the printed circuit board, associated spring means projecting from the second bar member towards the first bar member, and the second contact member is situated on said spring means for contacting a second, opposite face of the printed circuit board at said area adjacent the second edge of the printed circuit board, the contact members each having a contact surface and the associated pair of first and second contact members is biased with their contact surfaces towards each other by the associated spring means.

2. The contacting assembly as set forth in claim 1 wherein said first bar member comprises a core portion of a material which is a good conductor of electricity and a casing of chemically resistant material which fits snugly around said core portion.

3. The contacting assembly as set forth in claim 1 wherein said first bar member is of at least substantially round cross-section and wherein said clamp means on said first bar member is in the form of a sleeve which is electrically conductively fixed on the first bar member, and wherein the first contact member is in the form of a bar portion which projects at least substantially tangentially from said sleeve and affords said contact surface.

4. The contacting assembly as set forth in claim 3 wherein said bar portion on its side towards said spring means has a raised portion providing said contact surface.

5. The contacting assembly as set forth in claim 3 wherein said bar portion projects away from said first bar member on the side thereof remote from said second bar member.

6. The contacting assembly as set forth in claim 1 wherein said spring means comprises a spring plate and wherein said second contact member on said spring means comprises at least one contact pin projecting from said spring plate, the contact pin having a face that is remote from said spring plate to provide said contact surface of said second contact member.

7. The contacting assembly as set forth in claim 6 wherein said spring plate is fixed to said second bar member by screw means.

8. The contacting assembly as set forth in claim 6 wherein said second bar member has a fixing portion at a position on said second bar member that is remote from said first bar member, wherein said spring plate is fixed by screw means to said fixing portion of said second bar member, and wherein said spring plate has a free end portion which is remote from said fixing portion and from which said at least one contact pin projects towards the associated first contact member of said first bar member, at a location beyond a side of said first bar member that is remote from said second bar member.

9. The contacting member as set forth in claim 6 wherein said spring plate carries an actuating member for moving the second contact member away from the first contact member.

10. The contacting member as set forth in claim 1 wherein said second bar member is of a solid quadrangular cross-section.

11. The contacting assembly as set forth in claim 1, wherein the entire surface of the contacting assembly has an electrically insulating coating thereon with the exception of said contact surfaces of said contact members.

12. A contacting assembly for a printed circuit board support assembly having a carrier means for locating a first edge of a printed circuit board, the contacting assembly comprising: first and second bar members; spacer means holding said bar members in spaced-apart at least substantially parallel relationship; first contact means carried on said first bar member for contacting a first face of a printed circuit board in an area adjacent a second edge of said printed circuit board; spring means projecting from said second bar member at least substantially towards said first bar member; and second contact means on said spring means for contacting a second face of the printed circuit board in an area adjacent the second edge of said printed circuit board, wherein the second contact means is biased towards said first contact means by the force of said spring means, the first and second contact means having respective co-operable contact surfaces biased towards each other, thereby to electrically conductively engage said printed circuit board therebetween.

13. In an installation for processing printed circuit boards, a contacting assembly for contacting an area adjacent an edge of the boards, said contacting assembly comprising: first and second bar members disposed at a spacing from each other and in mutually parallel relationship; at least one carrier member on said first bar member; at least one first contact member projecting from said carrier member in a direction away from said second bar member for contacting one of said boards; and at least one second contact member carried by said second bar member and projecting towards and beyond said first bar member to a position adjacent said first contact member, said first and second contact members having respective contact surfaces co-operable with each other for engaging said one of said boards, said second contact member including spring means operable for biasing the contact surface of said second contact member towards the contact surface of said first contact member.

* * * * *